United States Patent
Carobolante

[11] Patent Number: 5,859,511
[45] Date of Patent: *Jan. 12, 1999

[54] MOTOR WITH INPUT-CONTROLLED HIGH SIDE DRIVER

[75] Inventor: Francesco Carobolante, San Mateo, Calif.

[73] Assignee: STMicroelectronics, Inc., Carrollton, Tex.

[*] Notice: The term of this patent shall not extend beyond the expiration date of Pat. No. 5,668,449.

[21] Appl. No.: 723,713

[22] Filed: Sep. 27, 1996

Related U.S. Application Data

[63] Continuation of Ser. No. 331,368, Oct. 27, 1994, Pat. No. 5,668,449.

[51] Int. Cl.$^6$ ................................................. H02K 23/00
[52] U.S. Cl. .................. 318/254; 318/138; 318/439; 318/599; 318/801; 318/807-812; 318/293; 318/597; 326/27; 326/34; 327/381; 327/389; 388/811-822; 363/40; 363/41
[58] Field of Search ................................ 318/254, 138, 318/439, 599, 801, 293, 597, 807–812; 326/27, 34, 23, 37; 327/381, 389, 384; 380/811–822, 829–833, 40; 363/41, 132

[56] References Cited

U.S. PATENT DOCUMENTS

| | | |
|---|---|---|
| 4,527,102 | 7/1985 | Gotou . |
| 4,633,150 | 12/1986 | Inaji et al. . |
| 4,746,813 | 5/1988 | Taenzer ................................. 318/138 |
| 4,746,843 | 5/1988 | Taenzer ................................. 318/138 |
| 4,765,426 | 8/1988 | Shimizu ................................ 318/293 |
| 4,853,563 | 8/1989 | Hill et al. ............................... 326/27 |
| 4,987,352 | 1/1991 | Ishii . |
| 5,017,845 | 5/1991 | Carobolante et al. . |
| 5,107,151 | 4/1992 | Cambier ................................. 326/34 |
| 5,172,036 | 12/1992 | Cameron . |
| 5,173,645 | 12/1992 | Naito . |
| 5,191,269 | 3/1993 | Carobolante . |
| 5,196,771 | 3/1993 | Naito . |
| 5,202,614 | 4/1993 | Peters et al. . |
| 5,202,616 | 4/1993 | Peters et al. . |
| 5,221,881 | 6/1993 | Cameron . |
| 5,233,275 | 8/1993 | Danino . |
| 5,258,695 | 11/1993 | Utenick et al. . |
| 5,258,696 | 11/1993 | Le . |
| 5,306,988 | 4/1994 | Carobolante ........................... 318/254 |
| 5,315,173 | 5/1994 | Lee et al. ................................ 326/27 |
| 5,319,289 | 6/1994 | Austin et al. . |
| 5,331,259 | 7/1994 | Naito . |
| 5,343,127 | 8/1994 | Maiocchi . |
| 5,397,967 | 3/1995 | Carobolante et al. ................. 318/254 |
| 5,397,972 | 3/1995 | Maiocchi . |
| 5,450,019 | 9/1995 | McClure et al. ........................ 326/27 |
| 5,455,885 | 10/1995 | Cameron . |
| 5,493,189 | 2/1996 | Ling et al. .............................. 318/254 |

OTHER PUBLICATIONS

"Full–wave Sensorless Drive ICs For Brushless DC Motors," Pouilloux, 10 Electronic Components & Applications 2 (1991).

"Self Synchronisation of PM Step and Brushless Motors; A New Sensorless Approach," Antognini, et al., Actuator 90: Proc. Of 2nd International Technology Transfer Congress at 44 (ed. K. Lenz 1990).

(List continued on next page.)

*Primary Examiner*—Karen Masih
*Attorney, Agent, or Firm*—David V. Carlson; Theodore E. Galanthay; Lisa K. Jorgenson

[57] ABSTRACT

A circuit for operating a polyphase DC motor, such as the type having a plurality of "Y" connected stator coils, has circuitry for charging the coils at a rate which will reduce EMI and other noise, while maintaining an acceptable charge rate. The gate of a selected high side driving transistor is charged at a relatively high rate during a ramping phase. During the ramping phase, the gates of the selected transistor is charged to a voltage near the voltage needed to form a channel in the transistor for conduction. After the ramping phase, the gates are charged at a lesser rate in order to control the rate of charging of the stator coils to prevent noise.

21 Claims, 5 Drawing Sheets

OTHER PUBLICATIONS

"A Full–Wave Motor Drive IC Based on the Back–EMF Sensing Principle," Bahlmann, 35 IEEE Trans'ns Consumer Electronics 415 (1989).

"Microprocessor Control of a Brushless DC Motor," in Proceedings of the Conference on Drives/Motors/Controls 84 at 80 (1984).

L68238S Data Sheet from SGS–Thomson Mircoelectronics.

MOTOR WITH INPUT-CONTROLLED HIGH SIDE DRIVER

This application is a continuation of U.S. patent application Ser. No. 08/331,368, filed Oct. 27, 1994, which issued as U.S. Pat. No. 5,668,449.

TECHNICAL FIELD OF THE INVENTION

This invention relates in general to motors, and more particularly to a driving circuit using a controlled high side driver for improved noise conditions.

BACKGROUND OF THE INVENTION

The present invention pertains to polyphase DC motors, and particularly to three-phase DC motors. Brushless, sensorless-type DC motors are used for rotating data media, such as found in computer-related applications, including hard disk drives, CD-ROM drives, floppy disks, VCRs (video cassette recorders), and the like. In computer applications, three-phase, brushless, sensorless DC motors are becoming more popular, due to their reliability, low weight and accuracy.

Motors of this type can typically be thought of as having a stator with three coils connected in a "Y" configuration, although a larger number of stator coils are usually employed with multiple motor poles. Typically, in such applications, 8-pole motors are used, which have four electrical cycles per revolution of the rotor. The stator coils, however, can be analyzed in terms of three "Y" connected coils. In operation, the coils are energized in sequences in which a current path is established through two coils of the "Y" with the third coil left floating in bipolar applications. The sequences are arranged so that as the current paths are changed, or "commutated", one of the coils of the current path is switched to float and the previously floating coil is switched into the current path. The sequence is defined such that when the floating coil is switched into the current path, current will flow in the same direction in the coil which was included in the prior current path. In this manner, six commutation sequences are defined for each electrical cycle in a three-phase motor.

Each coil is connected to a high side driver and a low side driver. When the high side driver is enabled, that coil will be operatively connected to a voltage supply for providing current through the coils. The low side driver selectively couples a coil to ground. Hence, the two coils can be chosen by appropriately enabling and disabling the high side and low side drivers. It is advantageous to enable the high side driver to quickly turn-on once its respective coil has been selected. However, a fast transition at the output of the driver will result in EMI (electromagnetic interference) and noise, which may create errors in the signals from the reading head of a hard drive. In the past, a significant amount of noise could be tolerated in the reading circuitry. However, with higher density hard drives and other devices, the circuitry is much more sensitive to electromagnetic interference and noise. Consequently, the use of prior art motors, and particularly the circuitry to drive the coils of a DC motor, can negatively effect performance of the hard drive or similarly sensitive device.

Therefore, a need has arisen in the industry for a motor with driving circuitry with reduced EMI and noise, while maintaining satisfactory speed performance.

SUMMARY OF THE INVENTION

In the present invention, stator coils are selectively driven through an associated high side drive transistor coupled between a voltage source and the coil. The gate of a selected high side drive transistor is charged at a relatively high rate during a ramping phase. During the ramping phase, the gates of the selected transistor is charged to a voltage near the voltage needed to form a channel in the transistor for conduction. After the ramping phase, the gates are charged at a lesser rate in order to control the slew rate of the output driving the stator coils to prevent noise.

The present invention provides significant advantages over the prior art. First, noise is reduced for superior performance in sensitive devices, such as high density hard drives. Second, delays are minimized by the ramping phase. Third, the controller can be operated in either linear mode or PWM mode (where the slew function is disabled) to conserve energy when desired.

BRIEF DESCRIPTION OF THE DRAWINGS

For a more complete understanding of the present invention, and the advantages thereof, reference is now made to the following descriptions taken in conjunction with the accompanying drawings, in which:

FIG. 4d is a electrical schematic diagram of the controlled driver circuits of FIG. 4a.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
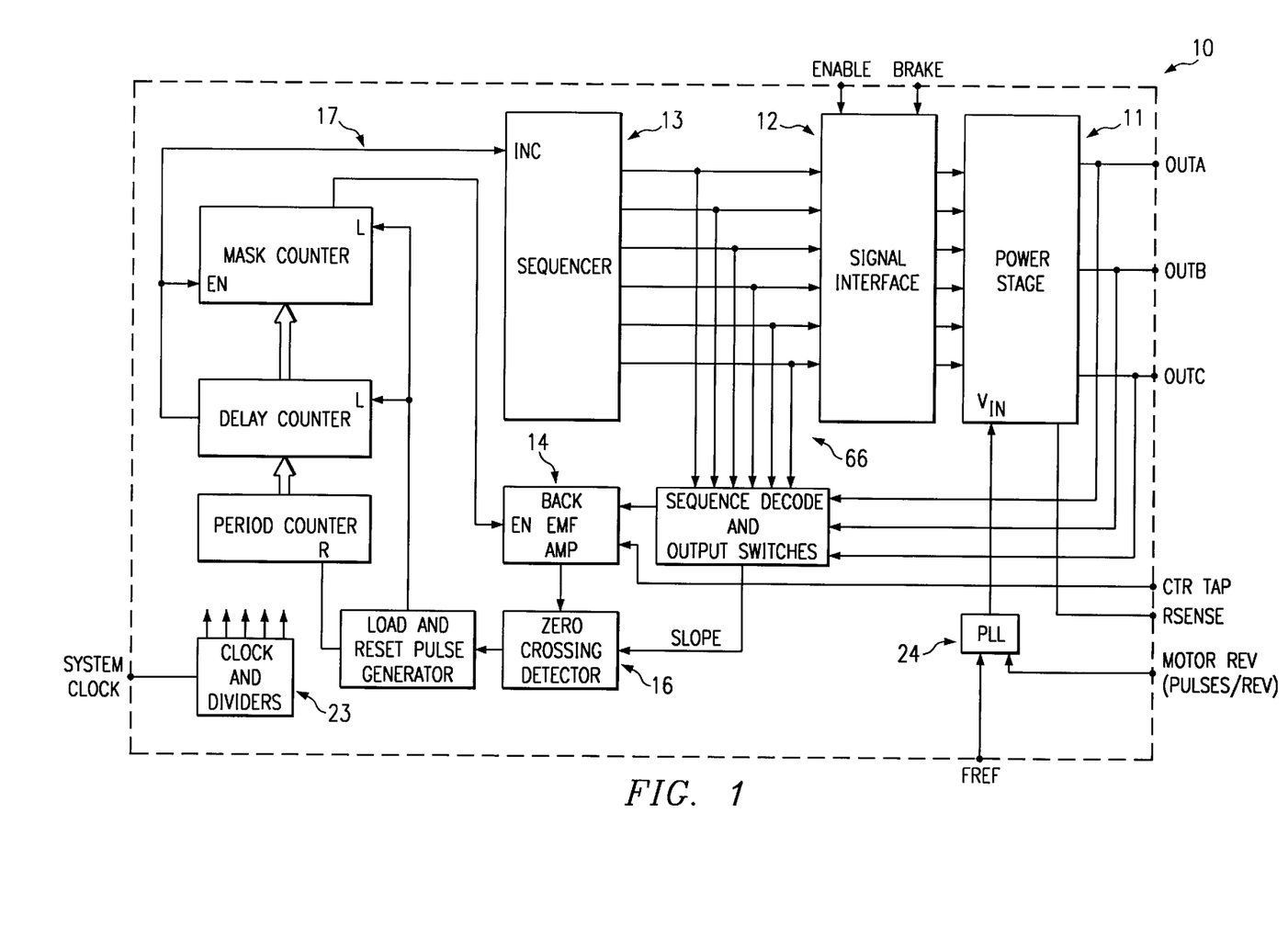
FIG. 1 is an electrical schematic block diagram of a motor driver system incorporating apparatus in accordance with a preferred embodiment of the invention.

A portion of an electrical schematic block diagram of a motor controller 10 in which the apparatus and method in accordance with a preferred embodiment of the invention may be incorporated is shown in FIG. 1. The diagram of FIG. 1 is simplified to demonstrate underlying principles of motor operation and control with the understanding that one skilled in the art could make various additions or substitutions while still benefitting from the present invention. Additional description of the structure and operation of polyphase DC motors is provided in U.S. Pat. No. 5,306,988, entitled "Method and Apparatus For Operating Polyphase DC Motors," issued Apr. 26, 1994, assigned to SGS-Thomson Microelectronics, Inc. and incorporated herein by reference.

The driving voltage is provided to the output terminals OUT A, OUT B, and OUT C by a power stage 11, which may be configured as described below with reference to FIG. 2. The power stage 11 is sequenced to provide sequential control output signals to the output terminals OUT A, OUT B, and OUT C by a sequencer circuit 13, described below with reference to FIG. 4a, and a signal interface circuit 12 supplies the output signals from the sequencer circuit 13 to the power stage 11, as well as enabling other functions, such as brake and output enable functions. The sequencer 13 also provides drive signals to other circuits of the controller circuitry to control the various aspects of rotation of the motor driven by the circuit 10.

The output terminals OUT A, OUT B, and OUT C are also switchably connected to a back-emf sense amplifier 14. The back-emf sense amplifier 14 in turn delivers signals to a reference voltage crossing detector circuit 16, which provides input signals to a digital delay circuit 17. The output of the digital delay circuit 17 controls the operation of the sequencer 13, in a manner below described in detail. The motor controller circuitry 10 includes a system clock circuitry 23, and phase lock loop (PLL) frequency/phase detector circuitry 24, and may include various other circuitry, not shown, such as circuitry to support pulse width modulation operation of the motor, "align and go" start up circuitry to facilitate start up of the motor from a stopped condition, port control logic and associated shift register circuitry to facilitate control of the motor controller circuitry by an external microprocessor (not shown), and so forth. Details of the operation of particular blocks of FIG. 1 are described in detail in U.S. Pat. No. 5,306,988, referenced above.

Figure 2:
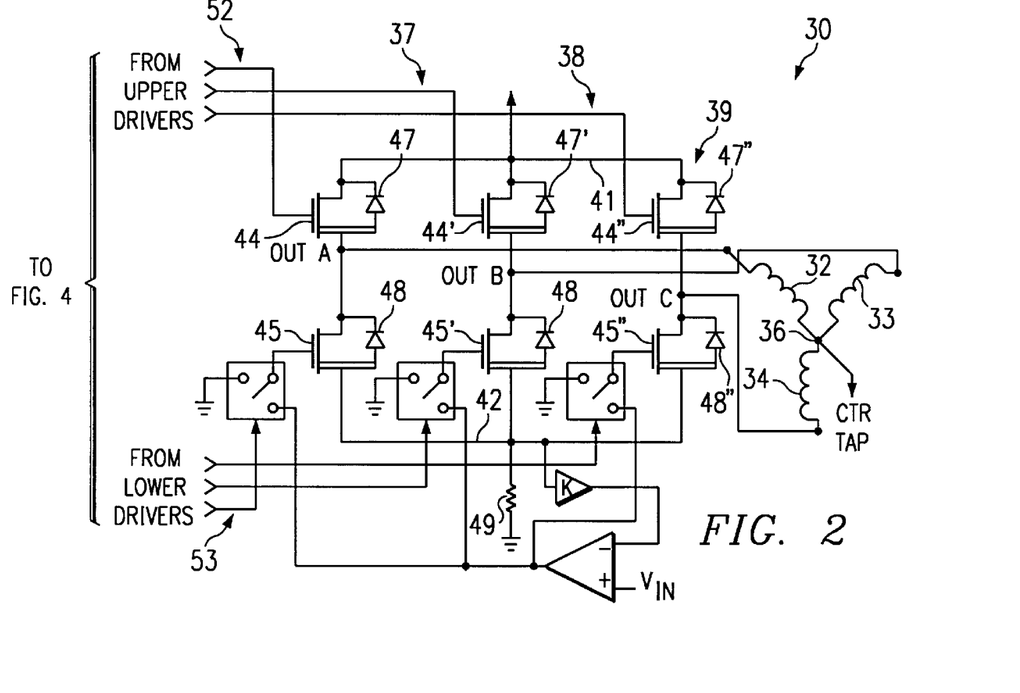
FIG. 2 is an electrical schematic diagram of the power stage used in the motor driver system of FIG. 1 for providing motor driving signals to the "Y" connected stator coils of the motor with which the driver system might be associated.

The power stage 11 of the motor control circuitry 10 may be a conventional H-bridge 30, commonly referred to as a triple-1/2-H-bridge, as shown in FIG. 2. Also, the Y connected stator windings 32, 33, and 34 are shown in FIG. 2 connected to switchably receive the driving current delivered by the power stage 11 of the motor control circuitry 10. Three series current paths 37, 38, and 39 are provided between a supply voltage applied to a line 41, through the lower driver transistors and a reference potential (ground) on line 42. Each current path includes, respectively, two switching transistors 44 and 45, 44' and 45' and 44" and 45". Transistors 44, 44' and 44" are known as the "high side drivers" while transistors 45, 45' and 45" are known as the "low side drivers. The transistors 44, 44', 44", 45, 45' and 45" can be of known power switch FETS, or other switch devices, as desired. In the illustrated embodiment, N-channel transistors 44, 44' and 44" and 45, 45' and 45" are used. The line 42 may be connected to an external sense resistor 49 (externally connected to terminals R SENSE, as shown in FIG. 1), which in turn is connected to ground. Other configurations for sensing output current including SENSEFETS, current mirrors, and the like are also possible.

One end of each of the stator coils 32, 33 and 34 is connected together at a common center tap 36, the other ends being connected to respective nodes OUT A, OUT B, and OUT C between the respective pairs of switching transistors 44–45, 44'–45' and 44"–45". Each of the switching transistors 44, 45, 44', 45', 44" and 45" has a flyback diode 48 47', 48' and 47", 48" which maybe connected in parallel with its current path, as shown.

Figure 3:
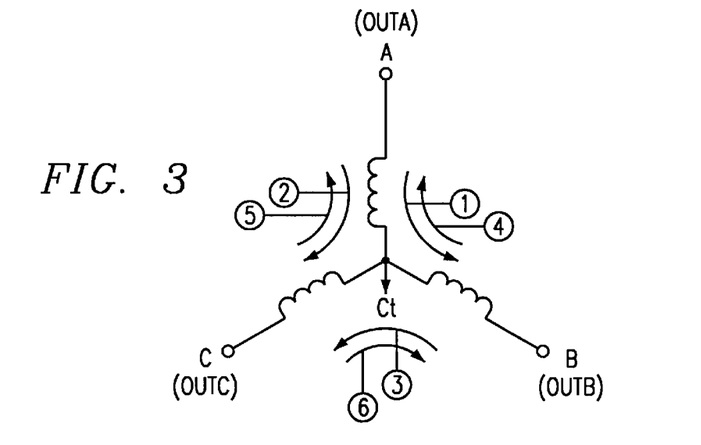
FIG. 3 is an electrical schematic diagram of a typically "Y" connected rotor coil arrangement, illustrating the current flow direction for six phases of a three-phase motor, in a bipolar driving configuration.

In operation, during an energized phase, one node (for example, node OUT A) is driven high by one of the upper switches 44. One node (for example node OUT B) is driven low by one of the lower switches 45' and the other node (for example, node C) is left floating with both switches 44" and 45" off. This may be referred to as the "AB phase." The coils are then switched in a commutation sequence determined by the sequence circuit 13 in a manner such that in each commutation phase current always flows in two of the three coils, with the third coil floating, and that after switching current will continue to flow, and in the same direction, in one of the two coils in which current was flowing in the previous phase. More particularly, as shown in the diagram of FIG. 3, in a three-phase motor, actually six operational phases exist. The current flow in each of these six phases as shown in the following Table A:

TABLE A

| Phase | Current Flows From: | To: | Floating Coil: |
|---|---|---|---|
| 1 | A | B | C |
| 2 | A | C | B |
| 3 | B | C | A |
| 4 | B | A | C |
| 5 | C | A | B |
| 6 | C | B | A |

Figure 4A:
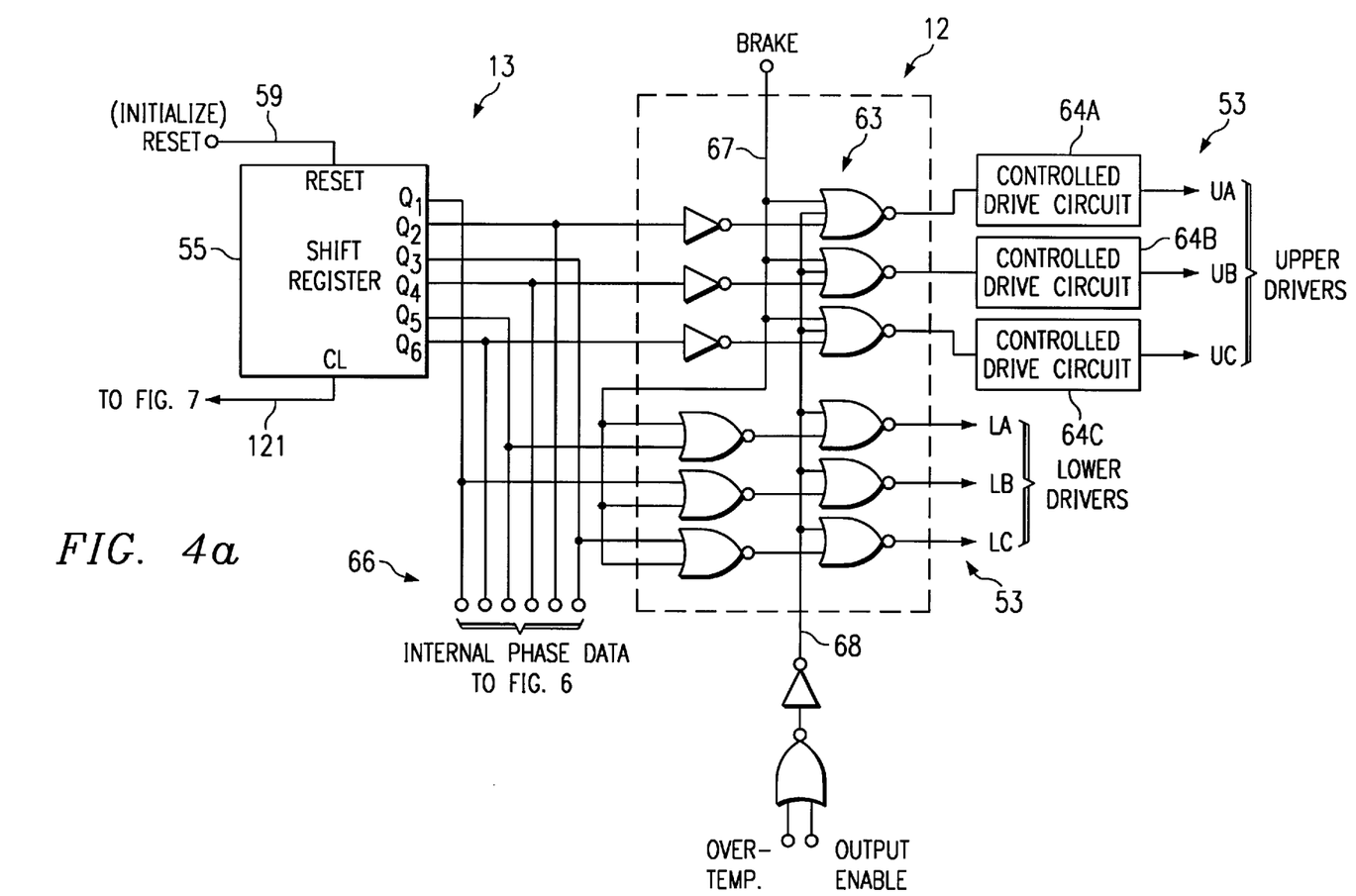
FIG. 4a is an electrical schematic diagram of a sequencer circuit used in the motor driver system of FIG. 1.

The switching of the driver transistors of the power stage 11 to effect the switching currents for each phase is accomplished by a sequencer circuit 13 and an associated interface circuit 12, as shown in FIG. 4a. The sequencer circuit 13 provides signals through the interface circuit 12 to the upper driver output 52 and the lower driver outputs 53 to accomplish the switching sequence outlined above in Table A. The upper and lower driver outputs 52 and 53 are connected to the upper and lower driver input lines, shown in FIG. 2.

More specifically, a shift register 55 (FIG. 4a) determines the specific upper and lower output lines which are activated at any particular instant. To accomplish the proper switching sequence, an appropriate sequence may be initially loaded into the shift register 55, and sequentially shifted through the various data positions of the shift register 55.

The other circuitry of the sequence circuit 13 includes a initialize line 59 to initialize or reset the shift register 55, reestablishing the commutation sequence code above described in an initial starting position within the shift register 55. The outputs $Q_1$–$Q_6$ of the shift register 55 are also connected via lines 66 to the reference voltage crossing logic control circuit. If desired, a brake signal developed elsewhere, perhaps externally to the motor control circuit 10, may be applied on line 67 to logic circuit 63 to prevent output to the motor on the upper and lower driver output lines 52 and 53 when such brake signal exists. The brake signal, which may be a software generated or external signal, is applied in the embodiment illustrated to turn on all the low side drivers, and to turn off all of the high side drivers. At the same time all of the coils 32, 33 and 34 may be shorted together so that the currents generated by the back emf in the coils 32, 33, and 34 brake the motor. Outputs of the logic circuit 63 are coupled to respective controlled drive circuits 64A, 64B and 64C, which generate outputs UA, UB and UC. The controlled drive circuits, referred to generally by reference numeral 64, are identical in structure.

Signals which might be generated in response to an internal error or other abnormal condition, or to an external enable signal that would not require the motor to be braked, but which may require the removal of drive signals to the coils of the motor, may be applied on a line 68 to the final driver logic gates 63 as shown. Thus, in the presence of a signal on the line 68 (that is, a change to a low state from a normally high state), the drive is removed or inhibited from both the upper drivers 52 and the lower drivers 53 allowing the rotor of the motor to coast.

Figure 4B:
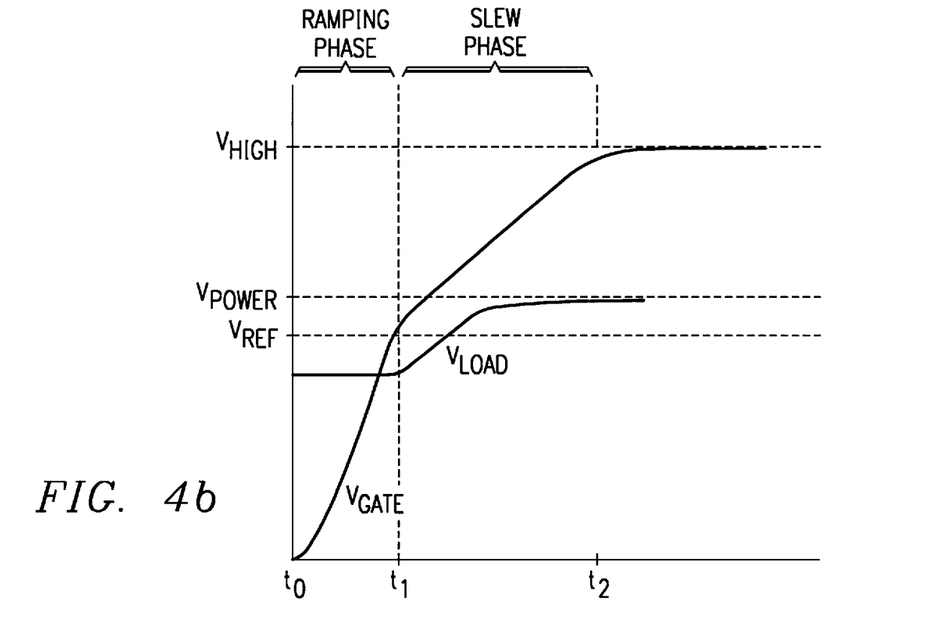
FIGS. 4b and 4c are graphs of a desired voltage profile for enabling the high side drivers 44, 44' and 44" of FIG. 2 during linear and PWM modes, respectively.
Figure 4C:
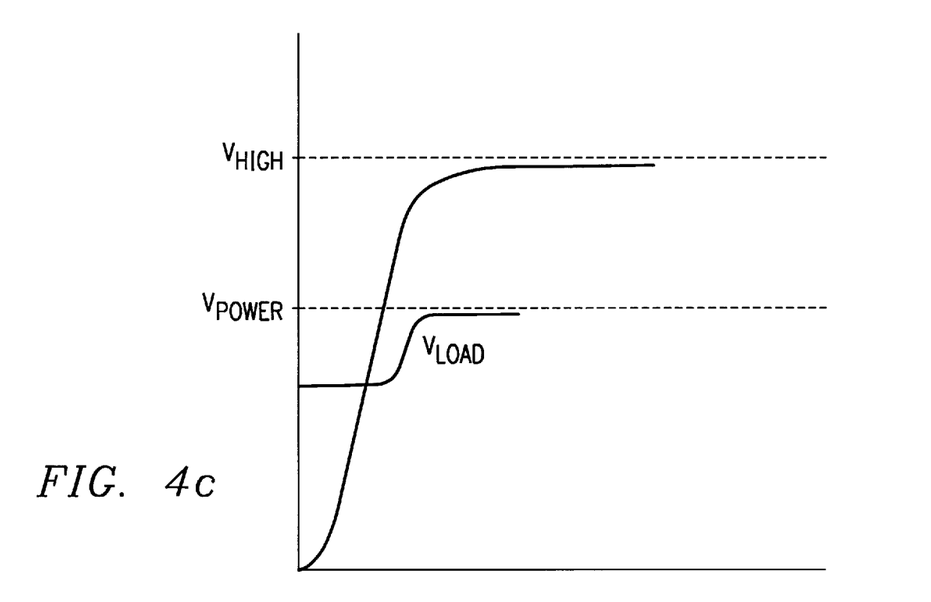

FIGS. 4b and 4c illustrate electrical diagrams for the desired gate voltage to the driving transistors 44, 44' and 44" for linear mode and pulse width modulated (PWM) mode, respectively. The gate voltage, $V_{GATE}$ is provided by the controlled drive circuit 64 to the appropriate driving transistor 44, 44' or 44". In FIG. 4b, the desired gate voltage is shown for applying to the driving transistors while the motor controller 10 is in linear mode, the mode used while data is being written to or read from the hard drive. The gate voltage signal in this mode is structured in two phases: a initial ramping phase shown from $t_0$ to $t_1$ and a slew phase shown from $t_1$ to $t_2$. During the ramping phase, the gate voltage transitions from approximately zero volts to a predetermined voltage, $V_{REF}$ at a steep slope. The fast transition during the ramping phase allows the gate voltage of the driving transistor 44 to reach a voltage slightly above the voltage of the source as soon as possible. A channel will not be formed in the high side drive transistor 44 until the gate voltage exceeds the voltage of the source of drive transistor 44 by one threshold voltage, $V_t$ (typically on the order of one volt). It should be noted that the initial voltage of the associated stator coil $V_{LOAD}$ (and hence the voltage of the high side driver's source) is very close to $V_{POWER}$, the voltage of the power supply, because that is the optimal switching point. Once the ramping phase is complete, the slew phase begins, wherein $V_{GATE}$ increases at a lesser slope, in order to avoid an abrupt change in voltage applied to one of the coils which would result in unacceptable EMI. Consequently, during the slew phase, the voltage of the associated coil, will transition relatively slowly between its initial voltage and $V_{POWER}$, while $V_{GATE}$ transitions between $V_{REF}$ and $V_{HIGH}$, the output of a charge pump.

FIG. 4c illustrates an electrical diagram for the output of the controlled drive circuit 64 for PWM mode. PWM mode is used during periods where reading and writing to the hard disk will not occur. PWM mode reduces the currents from the supply significantly, and therefore is used during periods when noise is not a factor, such as during start-up or when the disk is idle. In PWM, since noise is not a factor, $V_{GATE}$ transitions from zero volts to $V_{HIGH}$ at a steep slope. In the preferred embodiment, the slope is the same as the ramping phase slope of $V_{GATE}$ in linear mode. Accordingly, $V_{LOAD}$ has a steep transition from its initial value to $V_{POWER}$.

Figure 4D:
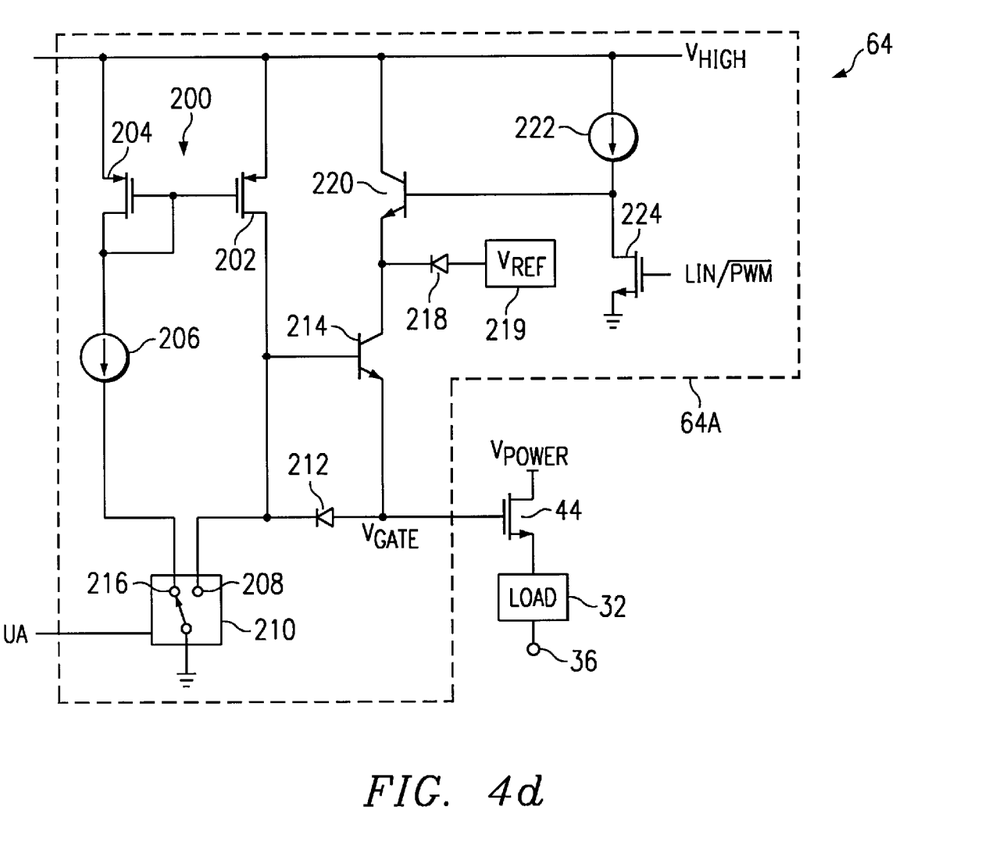

FIG. 4d illustrates circuitry for providing the gate signal to the driving transistors 44, 44' and 44", as described in connection with FIGS. 4b and 4c. For purposes of illustration, the circuitry will be shown for connection to driving transistor 44, it being understood that the same circuitry can be used for each of the drive control circuits 64A, 64B and 64C, with only the connections between the logic circuit 63 and the high side drive transistors 44, 44' and 44" being different.

As shown in FIG. 4d, a current mirror 200 is comprised of FET transistors 202 and 204. The first source/drain of each transistor 202 and 204 is coupled to $V_{HIGH}$. The second source/drain of transistor 204 is coupled to current source 206 and to the gates of transistors 202 and 204. The second source/drain of transistor 202 is coupled to a first node 208 of switch 210, the cathode of diode 212 and the base of npn control transistor 214. Current source 206 is also coupled to second node 216 of switch 210. Switch 210 selectively switches between nodes 208 and 216 responsive to signal UA. The emitter of control transistor 214 and the anode of diode 212 are coupled to the gate of driving transistor 44. The collector of control transistor 214 is coupled to the cathode of diode 218 and the emitter of npn transistor 220. The anode of diode 218 is coupled to $V_{REF}$ power source 219. The collector of transistor 220 is coupled to $V_{HIGH}$. Current source 222 is coupled between the base of transistor 220 and $V_{HIGH}$. N-channel transistor 224 has a first source/drain coupled to ground a second source/drain coupled to the base of transistor 220 and a gate coupled to control signal LIN/#PWM. When LIN/#PWM=1, the motor controller 10 is in linear mode; when LIN/#PWM=0, the motor controller 10 is in PWM mode.

In linear mode, transistor 224 is in a low impedance mode, thereby passing current from the current source 222 to ground. Thus, transistor 220 is effectively disabled. When switch 210 is enabled by UA to couple node 216 to ground, current source 206 causes a current ($I_B$) to pass into the base of control transistor 214. While control transistor 214 is not saturated (the ramping phase in FIG. 4b), a current $\beta I_B$, passes to the gate of high side driver 44 through the emitter of control transistor 214. When $V_{GATE}$ is charged to within approximately one volt of $V_{REF}$ (i.e., $V_{REF}$-1 volt), control transistor 214 will be in saturation and the emitter current will equal $I_B$, rather than $\beta I_B$. Consequently, the rate of change in $V_{GATE}$ will diminish when $V_{GATE}$>$V_{REF}$-1. This saturation condition results in the slew phase shown in FIG. 4b. Since the high side driver 44 will not pass current to its associated coil 32 until $V_{GATE}$>$V_{LOAD}$+$V_t$, the charging of the coil will occur during the slew phase, provided $V_{LOAD}$+$V_t$>$V_{REF}$-1. During the slew phase, the amount of current passed from $V_{POWER}$ to the coil 32 will depend upon the difference between $V_{GATE}$ and $V_{LOAD}$ (until transistor 44 is fully on). Therefore, by controlling the gate voltage of the drive transistor 44, the rate of change in the coil can be controlled to suppress noise. The rate of change of $V_{GATE}$ during the slew phase can be controlled by the magnitude of $I_B$.

If switch 210 is set by signal UA to couple node 208 to ground, any current through transistor 202 passes to ground; therefore $I_B$=0, and the gate of transistor 44 is discharged. Also, since node 216 is floating, there is not current through current source 206 and therefore the current mirror 200 will not produce any current to the base of control transistor 214.

In PWM mode (LIN/#PWM=0), transistor 224 is in a high impedance mode, thus the current from current source 222 drives the base of transistor 220, effectively coupling $V_{HIGH}$ to the collector of control transistor 214. Consequently, control transistor 214 will not saturate until $V_{GATE}$>$V_{HIGH}$-1. Therefore, $V_{GATE}$ will be charged by $\beta I_B$ until $V_{GATE}$ is much greater than $V_{POWER}$. Consequently, the transition of $V_{GATE}$ will be at the ramping phase rate, thereby charging the coil 32 faster than in the linear mode discussed above.

This aspect of the invention provides significant advantages over the prior art. Noise is reduced by charging gates of the high side drivers 44, 44' and 44" at a controlled slew rate while the drivers are conducting; the slew rate can be set to meet a desired noise requirement. However, during an initial ramping phase prior completed to enabling the high side driver, $V_{GATE}$ is charged at a faster rate. Thus, delays in charging the coils are minimized.

The present invention provides significant advantages over the prior art. Importantly, the EMI and noise is reduced by charging gates of the high side drivers 44, 44' and 44" at a controlled slew rate while the drivers are conducting; the slew rate can be adjusted as desired to meet a desired noise requirement. Delays in charging the coils are minimized by a ramping phase which charges the gate of the high side driver at a faster rate up until the point where the high side driver will conduct.

It should be noted that the circuit of FIGS. 4b–4d could be adapted to any circuit in which it is desirable to turn on a transistor at a fast rate while controlling the output of the transistor once the gate voltage reaches the point of conduction.

According to a disclosed class of innovative embodiments, there is provided a control circuit for operating a polyphase DC motor having a plurality of coils, the control circuit comprising a plurality of driving transistors for driving coils, where each of the driving transistors drives one of the respective coils at a rate responsive to a voltage applied to a control node of the driving transistor, and circuitry for providing a voltage signal to a selected control node such that the voltage signal varies at a first rate during a first phase and at a second rate during a second phase.

According to another disclosed class of innovative embodiments, there is provided a method for operating a polyphase DC motor having a plurality of coils, the method comprising the steps of selecting one of a plurality of driving transistors, each of the driving transistors being coupled to a respective coil, and providing a voltage signal to a control node of the selected driving transistor such that the voltage signal varies at a first rate during a first phase and at a second rate during a second phase.

According to another disclosed class of innovative embodiments, there is provided a control circuit for operating a polyphase DC motor having a plurality of coils, the control circuit comprising a plurality of FET transistors each having first and second source/drain regions coupled between a first voltage supply and a respective coil, circuitry for selecting one of the FET transistors to apply current to its respective coil, and drive control circuitry for controlling the voltage on a gate of the selected FET transistor, such that the gate is charged to a first predetermined voltage at a first rate and to a second predetermined voltage at a second rate. Within this class of embodiments, the control circuit may further comprise circuitry to disable the drive control circuitry such that the gate is charged to the second predetermined voltage at the first rate.

Although the invention has been described and illustrated with a certain degree of particularity, it is understood that the present disclosure has been made by way of example only, and that numerous changes in the combination and arrangements of parts and features can be made by those skilled in the art without departing from the spirit and scope of the invention, as hereinafter claimed.

What is claimed is:

1. A control circuit for operating a polyphase DC motor having a plurality of coils, said control circuit comprising:
    a plurality of driving transistors for driving said coils, each of said driving transistors being coupled between a voltage source and a respective one of said coils and being driven at a rate responsive to a voltage applied to a control node of said driving transistor;
    a plurality of control transistors, each control transistor having a first terminal coupled to a reference voltage and a second terminal coupled to the control node of a respective one of said driving transistors, said control transistor being structured to provide a current from said second terminal to said control node of said driving transistor, said voltage applied to said control node varying at a first rate during a first phase and at a second rate during a second phase based on the current provided from said second terminal.

2. The control circuit of claim 1 wherein each of said driving transistors comprises a FET transistor having a gate as a control node.

3. The control circuit of claim 1 wherein said voltage applied to said control node varies at said first rate until said voltage applied to said control node is near a voltage at which said driving transistor will conduct and at said second rate while said driving transistor is conducting current to its respective coil.

4. The control circuit of claim 1 wherein said second rate is lower than said first rate.

5. The control circuit of claim 1 wherein said control transistor is structured to provide the current to said control node at a rate responsive to a difference between the voltage applied to said control node and said reference voltage.

6. The control circuit of claim 5 wherein said control transistor is a bipolar transistor having a first terminal collector coupled to said reference voltage and a second terminal emitter coupled to said control node of said driving transistor, said control transistor being structured to provide the current to said control node at a first level during the first phase and at a second level during the second phase.

7. The control circuit of claim 6, further comprising circuitry for selectively providing a second voltage to said first terminal collector.

8. A method of operating a polyphase DC motor having a plurality of coils, comprising the steps of:
    selecting one of a plurality of driving transistors, each of said driving transistors being coupled to a respective one of said coils; and
    providing a current from a control transistor coupled between a reference voltage and a control node of said selected driving transistor, said current being provided to said control node to control a voltage of said control node, said voltage of said control node varying at a first rate during a first phase and at a second rate during a second phase based on said current provided by said control transistor.

9. The method of claim 8 wherein said step of providing a current comprises the step of providing a current from a transistor coupled between a reference voltage and a gate of a selected FET transistor, said current being provided to said gate to control a voltage of said gate, said voltage of said gate varying at a first rate during a first phase and at a second rate during a second phase.

10. The method of claim 8 wherein said step of providing a current further comprises the step of providing said current at a first level until the voltage of said control node is near a voltage at which said selected driving transistor will conduct and at a second level while said selected driving transistor is conducting current to its respective coil.

11. The method of claim 8 wherein said second rate is lower than said first rate.

12. The method of claim 8 wherein said step of providing a current further comprises the steps of
    providing said current at a rate responsive to a difference between the voltage of said control node and said reference voltage.

13. A control circuit for operating a polyphase DC motor having a plurality of coils, the control circuit comprising:
    a plurality of FET transistors, each FET transistor being coupled between a first voltage supply and a respective coil;
    circuitry for selecting one of said FET transistors to apply current to its respective coil; and
    a control transistor having a first terminal coupled to a reference voltage and a second terminal coupled to a gate of said selected FET transistor, said control transistor being structured to provide a current from the second terminal to said gate for controlling a voltage of said gate, said gate being charged to a first predetermined voltage at a first rate and subsequently being charged to a second predetermined voltage at a second rate based on the current from the second terminal of the control transistor.

14. The control circuit of claim 13 wherein said first rate is higher than said second rate.

15. The control circuit of claim 13 wherein each of said plurality of FET transistors comprises an n-channel FET transistor.

16. The control circuit of claim 13 wherein said control transistor is structured to provide said current to said gate at a rate responsive to a difference between the voltage of said gate and said reference voltage.

17. The control circuit of claim 16 wherein said control transistor is a BJT transistor structured to provide said current from said second terminal to said gate at a first rate when the BJT transistor is not in a state of saturation and at a second rate when the BJT transistor is in a state of saturation.

18. The control circuit of claim 13, further comprising circuitry structured to provide an alternate reference voltage to the first terminal of said control transistor such that said gate is charged to said second predetermined voltage at said first rate.

19. A method of controlling a rate of change of voltage applied to a coil from a driving transistor coupled between a power supply and the coil, the method comprising the steps of:

providing a first voltage to a first terminal of a control transistor;

providing a controlled current from a second terminal of the control transistor to a control terminal of the driving transistor; and governing the controlled current based on a difference between the first voltage and a voltage of the control terminal of the driving transistor, the controlled current being provided at a first rate during a first phase and at a second rate during a second phase.

20. The method of claim 19 wherein the step of governing the controlled current further comprises the step of providing the controlled current at the first rate while the control transistor is in an unsaturated state and at the second rate while the control transistor is in a saturated state, the first rate being greater than the second rate.

21. The method of claim 19, further comprising the step of providing a second voltage which is higher than the first voltage to the first terminal of the control transistor such that the controlled current is provided at the first rate.

* * * * *